United States Patent [19]

Uemura et al.

[11] 4,034,317
[45] July 5, 1977

[54] ULTRASONIC DELAY LINES AND METHOD OF MAKING THE SAME

[75] Inventors: Michihiko Uemura; Tohru Kanbara, both of Yokohama; Yutaka Igarashi, Kawasaki, all of Japan

[73] Assignee: Asahi Glass Co., Ltd., Tokyo, Japan

[22] Filed: Mar. 4, 1976

[21] Appl. No.: 663,703

[30] Foreign Application Priority Data
Mar. 13, 1975 Japan .................................. 50-29468

[52] U.S. Cl. ................................. 333/30 R; 29/25.35; 310/8.3
[51] Int. Cl.² .............. H03H 9/30; H03H 9/26; H03H 9/32; H01L 41/04
[58] Field of Search .................... 333/30 R, 72, 29; 310/8, 8.1, 8.2, 8.3, 8.6, 8.5; 29/25.35, 594

[56] References Cited
UNITED STATES PATENTS

| | | | |
|---|---|---|---|
| 2,839,731 | 6/1958 | McSkimin | 333/30 R |
| 2,859,415 | 11/1958 | Fagen | 333/30 R |
| 3,581,247 | 5/1971 | Belford et al. | 333/72 X |

*Primary Examiner*—Alfred E. Smith
*Assistant Examiner*—Marvin Nussbaum
*Attorney, Agent, or Firm*—Oblon, Fisher, Spivak, McClelland & Maier

[57] ABSTRACT

A multiple reflection type solid ultrasonic delay line which comprises a solid ultrasonic delay medium in the form of a thin flat plate having input and output transducers and reflection elements formed on the periphery thereof, and one or more arc grooves provided on part of side surfaces which is other than desirable reflection elements for ultrasonic vibration and a low melting metal or alloy being provided in said arc grooves. In the delay lines, undesirable signals are remarkably attenuated.

8 Claims, 4 Drawing Figures

ULTRASONIC DELAY LINES AND METHOD OF MAKING THE SAME

BACKGROUND OF THE INVENTION

1. Field of the Invention

This invention relates to a solid ultrasonic delay line, and more particularly it relates to a multiple reflection type solid ultrasonic delay line in which undesirable signals are remarkably attenuated and method of making the same.

2. Description of Prior Art

The conventional ultrasonic solid delay lines comprise a delay medium for propagating ultrasonic vibration such as glass, quartz, metal, ceramic, etc.; an input transducer for converting electric signals to ultrasonic vibration and an output transducer for converting ultrasonic vibration to an electric signal which are bonded on a desirable side surface of the delay medium, and which are polarised to the direction vertical to the ultrasonic vibration propagating direction and parallel to the major surfaces of the delay medium.

The transducers are made of piezo-electric materials such as quartz, lead titanate zirconate solid solution, etc.. These ultrasonic delay lines have been used for PAL colour television receiver, VTR etc.. The delay time is decided by the time required for propagating the ultrasonic vibration through the delay medium to reach the output transducer.

From the viewpoint of nondispersive propagation characteristics and compact structure, it is preferable to use a multiple reflection type solid ultrasonic delay line of a thin flat plate wherein the thickness of said flat plate in parallel to the direction for propagating ultrasonic vibration, is less than several times of the wavelength of the ultrasonic vibration. However, in the multiple reflection type solid ultrasonic delay lines, undesirable signals due to the diverging signals reaching the output transducer by paths other than intended are found.

In order to attenuate the undesirable signals, it has been proposed to provide an energy attenuation material on parts of the major surface of the delay medium other than the desired path of the ultrasonic vibration. However, it is disadvantageous to produce said delay line in mass production because energy attenuation materials must be provided on the major surfaces of the delay medium, of each unit produced. It has also been proposed to provide an energy attenuation material on portions of side surfaces other than desirable reflection elements for ultrasonic vibration on the side surfaces of a delay medium (hereinafter referred to as undesirable reflection elements).

The thickness (width of the side surface) of the delay medium is thin and the area for attenuating undesirable signals is narrow. Accordingly, it is hard to attenuate remarkably undesirable signals with the exception of matching the mechanical impedances between the energy attenuation material and the delay medium and providing enough thickness of the energy attenuation material.

It has been impractical to use such products because of the difficulty of the matching mechanical impedance, and of the method and accuracy for providing the products in practical manufacturing and because of the disadvantage that the energy attenuation material is easily peeled off.

SUMMARY OF THE INVENTION

It is an object of this invention to provide an ultrasonic delay line in which undesirable signals are remarkably attenuated.

It is another object of this invention to provide a method of making ultrasonic delay lines in which undesirable signals are remarkably attenuated and which is suitable for mass production.

These objects of the invention has been attained by providing a low melting metal or alloy within one or more arc grooves on the undesirable reflection elements of the multiple reflection type delay line.

DETAILED DESCRIPTION OF THE PREFERRED EMBODIMENTS

Figure 1:
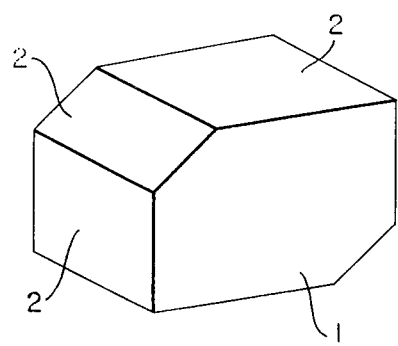
FIG. 1 shows in perspective a preshaped block of delay medium.

The undesirable reflection elements in this case mean portions of side surfaces with the exception of those elements desirable for ultrasonic vibration reflection in the desirable path defined by the input and output transducers.

The reasons why the low melting metal or alloy is used as the energy attenuation material provided within one or more arc grooves is that the low melting metal or alloys has a high absorption coefficient of ultrasonic vibration, and the mechanical impedance between the delay medium and these materials matches well.

In the delay line of this invention, the ultrasonic vibration which disperses out of the desired path of ultrasonic vibration is absorbed in the low melting metal or alloy.

The vibration of reflected waves caused by the undesirable reflection facets and the ultrasonic vibration transmitted again to the delay medium without being absorbed in the energy attenuation material is uniformly scattered by the arc grooves whereby undesirable signals can be remarkably attenuated. The energy attentuation material is positioned in the illustrated arc-shaped grooves and thus is not easily peeled off by mechanical force.

The low melting metal or alloy used in this invention can be various known low melting materials such as alloys having main components of Pb, Sn or Bi. In the manufacture of the delay lines of this invention wherein undesirable signals are remarkably attenuated, a delay medium is ground in a desirable shape to form a preshaped block.

One or more arc shaped grooves are formed in the undesirable reflection elements for ultrasonic vibration.

The input and output transducers are bonded at the predetermined position of the block and the low melting metal or alloy is provided within the arc shaped grooves. The block is sliced in the direction perpendicular to the surfaces having the input and output transducers, and parallel to the major surfaces of the delay medium.

The ultrasonic delay lines used for PAI, colour television receiver, and VTR need to have a delay time accuracy being less than 1/10,000. In order to directly produce such delay lines from the composite block, it is necessary to have processing accuracy of less than several microns as to linear tolerances and less than several tens of seconds angle as to angular tolerances. It is necessary to have similar accuracy for providing the input and output transducers.

In the manufacture of delay lines having said accuracy, a preshaped block which is ground to dimension larger than the precise size and shaped to precise angular tolerances is used and the arc grooves are formed in the undesirable reflection elements of the block, and then the low melting metal or alloy is provided within the arc grooves and the transducers are bonded at predetermined positions and the composite block is sliced in the direction perpendicular to the surfaces having the input and output transducers, and one side surface of the sliced block is ground until a desired delay time is given under test conditions.

According to this invention, it is possible to form grooves on the undesirable reflection elements of the delay medium of a thin flat plate in an accurate and precise manner without breaking the plate through the formation of grooves. The low melting metal or alloy is provided within the arc grooves whereby the position and the accuracy of size e.g. width and thickness of the low melting metal or alloy can be uniform and it is not peeled off in the slicing step.

As the low melting metal or alloy is used as the energy attenuation material, the energy attenuation material is stable and is not deteriorated or is not peeled off by water or organic solvents in a washing step after slicing the block in comparison with the cases of organic energy attenuation materials.

Referring to the drawings, embodiments of the ultrasonic delay line and the manufacture thereof will be further described.

Figure 2:
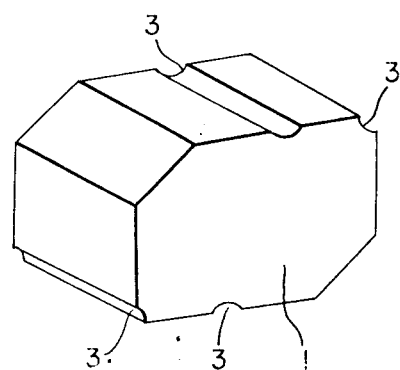
FIG. 2 shows the preshaped block of FIG. 1 wherein arc grooves are formed in the undesirable reflection elements for ultrasonic vibration.

In order to attain the mass production of the thin flat plate type glass delay line, a hexagonal block made of glass as shown in FIG. 1 is prepared. The block is ground to a preselected size larger than the size required for a desirable delay time and the velocity of ultrasonic vibration. The arc grooves 3 are formed in the undesirable reflection elements as shown in FIG. 2.

Figure 3:
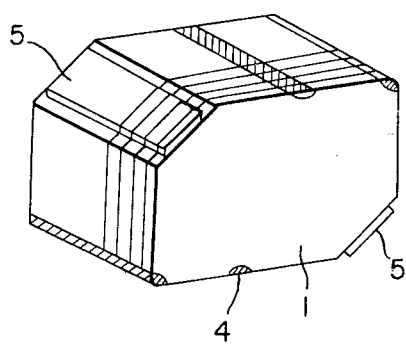
FIG. 3 shows the composite block provided with a low melting point metal or alloy on the curved surfaces of the arc grooves and bonded transducers, and then sliced with a diamond wheel.
Figure 4:
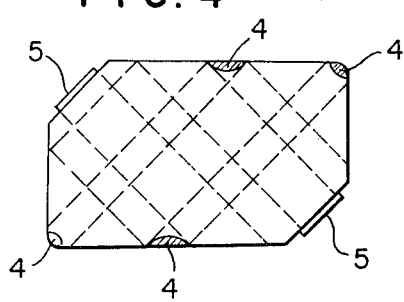
FIG. 4 shows an ultrasonic delay line according to this invention. The dashed lines indicate the location of the boundaries of each segment of the desired path for propagating the ultrasonic vibration from the input trandsucer to the output transducer.

The curved surfaces of the arc grooves and the predetermined parts for providing the transducers 5 on the side surfaces 2 of the block, are coated with a metal film formed by vapor deposition or chemical plating. The transducer 5 is bonded at the proper position and the low melting point metal or alloy 4 is provided within the grooves 3 as shown in FIG. 3. The block is sliced in a desirable thickness (about 1 mm) in the direction perpendicular to the side surface 2 as shown in FIG. 3.

One reflective element of each sliced composite block is precisely ground until the desirable delay time is given under test conditions. The delay lines of the invention are compared with the conventional delay lines and the SN ratio (signal/noise) are shown in Table 1.

Table 1

| Structure of delay lines | SN ratio (dB) |
| --- | --- |
| No treatment as shown in FIG. 1 | 23 |
| Arc grooves as shown in FIG. 2 | 30 |
| Epoxy resin provided in arc grooves of FIG. 2 | 32 |
| Low melting alloy provided in arc grooves of FIG. 3 | 37 |

SN ratio $= -20 \log \frac{Ex}{Eo}$ (dB)

Eo: output signal
Ex: undesirable signal

The characters of the materials used in said structures are as follows.

Table 2

| material | density (g/cm$^3$) | velocity (10$^5$cm/s) | mechanical impedance (10$^5$g/cm$^2$s) | attenuation constant at 5MH$_z$(dB/mm) |
| --- | --- | --- | --- | --- |
| delay medium | 3.43 | 2.74 | 9.4 | — |
| epoxy resin | 0.9 | 1.0 | 0.9 | about 4 |
| low melting alloy | 9.95 | 1.06 | 10.5 | about 5 | low melting alloy: Bi : 50,0, Sn : 17.8, Pb : 32.2 (% by weight)

From Table 1 and Table 2, the delay line of our invention highly attenuates undesirable signals in comparison with the other delay lines.

What we claim is:

1. In a multiple reflection type solid ultrasonic delay line comprising a solid ultrasonic delay medium in the form of a thin flat plate having input and output transducers and reflection elements formed on the periphery thereof, the improvement comprising:

at least one arc shaped groove formed in a side surface of said plate having elements from which the reflection of ultrasonic vibration is undesirable; and, a low melting point metallic material provided in said groove for vibration absorption.

2. A method of making a multiple reflection type solid ultrasonic delay line which comprises the steps of:

grinding a delay medium in a desirable shape to form a preshaped block, forming grooves in surfaces of said block having elements from which the reflection of ultrasonic vibration is undesirable, curving the surfaces of the grooves to make them arc-shaped, bonding input and output transducers to predetermined surfaces of said block, placing a low melting point metallic material in said grooves; and, slicing said block in a direction perpendicular to said surfaces on which said transducers are bonded.

3. A method as in claim 2, further comprising the step of:

grinding one reflective facet of said sliced composite block to obtain a desired delay interval.

4. A method as in claim 2, further comprising the step of:

coating said grooves with a metallic film prior to said step of placing.

5. A method as in claim 2, wherein said step of forming includes the step of:

forming grooves in corners of said block from which ultrasonic reflection is undesirable.

6. A method as in claim 2, further comprising the step of:
selecting lead as the main component of said low melting point metallic material.

7. A method as in claim 2, further comprising the step of:
selecting tin as the main component of said low melting point metallic material.

8. A method as in claim 2, further comprising the step of:
selecting bismuth as the main component of said low melting point metallic material.

* * * * *